United States Patent
Jonas et al.

(10) Patent No.: US 7,957,829 B2
(45) Date of Patent: Jun. 7, 2011

(54) METHOD FOR POSITIONING AND/OR GUIDING AT LEAST ONE ARBITRARY PROCESS HEAD FOR THE METALIZATION OF THIN SUBSTRATES AT A DEFINED DISTANCE ABOVE THE SUBSTRATE SURFACE

(75) Inventors: Stefan Jonas, Berlin (DE); Lutz Redmann, Kleinmachnow (DE); Michael Merscher, Berlin (DE); Claudio Uriarte, Berlin (DE)

(73) Assignee: Jonas & Redmann Automationstechnik GmbH, Berlin (DE)

( * ) Notice: Subject to any disclaimer, the term of this patent is extended or adjusted under 35 U.S.C. 154(b) by 221 days.

(21) Appl. No.: 12/336,799

(22) Filed: Dec. 17, 2008

(65) Prior Publication Data

US 2010/0121477 A1    May 13, 2010

(30) Foreign Application Priority Data

Nov. 11, 2008  (DE) .......................... 10 2008 057 005

(51) Int. Cl.
*G06F 19/00*        (2011.01)
(52) U.S. Cl. ......................................... 700/121; 700/98

(58) Field of Classification Search .................. 700/121, 700/98, 283, 302; 347/86, 14, 12
See application file for complete search history.

(56) References Cited

FOREIGN PATENT DOCUMENTS

DE           69230099          3/2000

*Primary Examiner* — Kidest Bahta
(74) *Attorney, Agent, or Firm* — Notaro, Michalos & Zaccaria P.C.

(57) ABSTRACT

A method for positioning or guiding at least one arbitrary print head or a printing unit having at least one pressure nozzle for the imprinting of thin substrates such as wafers at a defined distance above the surface of the substrate, which is to be provided on a support like a paddle or printing table. Distance sensors continuously acquired distance measurements to the surface of the substrate which is to be imprinted. An adjustment of the print head up to 6 degrees of freedom is ensured by actuators in such a manner that the section of the opening of the pressure nozzle of the print head can be adjusted so as to be coplanar to the section of the surface of the substrate which is to be imprinted. The print head is thus maintained or readjusted so as to adjust the section of the opening of the pressure nozzle of the print head to the surface of the substrate which is to be positioned on the support table so as to be coplanar and so as to maintain the coplanar position during the printing process.

20 Claims, 12 Drawing Sheets

METHOD FOR POSITIONING AND/OR GUIDING AT LEAST ONE ARBITRARY PROCESS HEAD FOR THE METALIZATION OF THIN SUBSTRATES AT A DEFINED DISTANCE ABOVE THE SUBSTRATE SURFACE

FIELD AND BACKGROUND OF THE INVENTION

The invention relates to a method for positioning and/or guiding at least one arbitrary process head (print head) or a printing unit comprising at least one pressure nozzle for the metallization (imprinting) of thin substrates such as wafers at a defined distance above the surface of the substrate (wafer), which is to be provided on a support (paddle; printing table). The invention also relates to a device, comprising at least one print head for carrying out such a method.

A screen printing machine for the solar cell production comprising a printing unit, which can be moved up and down, and a printing table, via which a conveyor belt can be moved, wherein provision is made for a positioning device, which positions the solar cells on the conveyor belt so as to be accurately aligned to the printing unit, is known from DE 10 2006 558 A1. An adjusting device for the printing unit is not required here.

In a screen printing method known from DE 692 30 099 T2, a substrate, which is to be imprinted, is fixed on a printing table, wherein the substrate and the screen, which is used, are provided with reference marks. The position of the reference marks of the substrate applied on the printing table is optically captured and stored by means of an observation unit, which is positioned above the printing table. In response to the positioning of the screen above the substrate, which is to be imprinted, the position of the reference marks of the screen and the relative position of the screen to the substrate on the printing table is determined thereby and the reference marks on the substrate and on the screen are aligned by means of a corresponding correction of the position of the screen.

SUMMARY OF THE INVENTION

The invention is based on the object of providing a method and a device of the afore-mentioned type in such a manner that the positioning and/or guiding of at least one print head or of a printing unit comprising at least one pressure nozzle for the metallization (imprinting) of thin substrates such as wafers at a defined distance above the substrate surface (wafer surface) is to be carried out effectively and accurately in such a manner that the section of the opening of the pressure nozzle of the print head is to be adjusted so as to be coplanar to the surface of the substrate (wafer), which is to be positioned on the support table, and so that the coplanar adjustment is to be maintained during the printing process.

According to the invention, this object is solved in that the section of the opening of the pressure nozzle of the print head is adjusted so as to be coplanar to the surface of the substrate (wafer), which is to be positioned on the support table, and in that the coplanar adjustment is maintained during the printing process in that upper and lower distance sensors, respectively, are initially positioned at the print head and at the support (paddle; printing table) for the substrate (wafer) so as to correspond to one another and so as to be calibrated according to a calibrating routine, according to which the distance between the upper and lower distance sensors, which are assigned to one another, is determined by means of a standard body, the incline of the surface of the support (paddle; printing table) for the substrate (wafer) and, at the same time, the distance between a reference section (reference plate) provided at the print head and the section of the opening of the pressure nozzle are determined by means of the distance sensors, the position of the pressure nozzle with reference to the surface of the support (paddle; printing table) is subsequently determined via the distance between the reference plate of the print head and the section of the opening of the pressure nozzle and the angle of inclination of the surface of the support (paddle; printing table), the respective thickness and thickness variations (wedge shape) of the substrate (wafer), which is to be imprinted, are then furthermore determined by means of a thickness and thickness variation measuring device, the section of the surface of the substrate (wafer), which is to be imprinted, is determined in the space via the already determined section of the surface of the support (paddle; printing table) in the space and via the previously determined geometry of the substrate (wafer) after a subsequent positioning of the substrate (wafer) on the support (paddle; printing table), the print head is then set into rotation about its X and/or Y axis by means of a process actuator until the section of the opening of the pressure nozzle is adjusted so as to be coplanar to the section of the surface of the substrate (wafer), which is to be imprinted, the two-dimensional arrangement of the substrate (wafer), which is to be imprinted and which is positioned on the support (paddle; printing table), is subsequently captured pictorially by means of a camera, the substrate (wafer) length, width and the angle γ of the rotation of the substrate (wafer) position on the surface of the support (paddle; printing table) are then determined with reference to the Z axis of the print head by means of an image evaluation, the print head is subsequently rotated about its Z axis by means of a process actuator according to the determined angle of rotation γ, the distance between the section of the opening of the pressure nozzle and the surface of the substrate (wafer), which is to be imprinted, is then continuously measured by means of the upper distance sensors, which are provided at the print head, the respective measuring data are subsequently input into a process actuator for starting the forward movement of the print head in the direction of the X axis (printing direction), wherein the process actuator continuously advances the print head in the direction of the X axis (printing direction) thereof until the pressure nozzle reaches an initial printing position via a feedback of the output of the process actuator to the input thereof, said initial printing position being defined by the previously determined position of the first flange of the substrate (wafer), which is positioned on the surface of the support (paddle; printing table)

and in which the operation of the pressure nozzle (printing process) is started by means of the process actuator, wherein the advance of the print head in the direction of the X axis (printing direction) thereof and thus the operation of the pressure nozzle is maintained via a feedback of the output of the latter to the input of the process actuator until a final printing position is reached, which is defined by the previously determined position of the second flange of the substrate (wafer), which is positioned on the support (paddle; printing table), and in which the process actuator turns off the operation of the pressure nozzle and the process is subsequently ended immediately or only when the determination of the section of the surface of a substrate (wafer), which is to be imprinted subsequently, has been carried out via the section of the surface of the support (paddle; printing table), which is to be newly determined, and when the evaluation of the thickness and thickness variation measurement of the substrate (wafer), which is to be imprinted subsequently, has been carried out.

The above-mentioned object of the invention is also solved by means of a method of the afore-mentioned type, which is characterized by the following method steps:

distance sensors, which are to be provided in each case at the print head in printing direction upstream of the pressure nozzle, are initially calibrated at a fixed distance to a predetermined calibrating section and, at the same time, the externally measured vertical distance between the section of the distance sensors and the section of the opening of the pressure nozzle is predetermined, the position of the section of the opening of the pressure nozzle in the space to the distance sensors at the print head is subsequently determined via the measured vertical distance between the section of the distance sensors and the section of the opening of the pressure nozzle and via the fixed distance of the distance sensors to the calibrating section, the two-dimensional arrangement of the substrate (wafer), which is to be imprinted and which is positioned on the support (paddle; printing table), is subsequently captured pictorially by means of a camera, the substrate (wafer) length, width and the angle γ of the rotation of the substrate (wafer) position on the surface of the support (paddle; printing table) are subsequently determined with reference to the Z axis of the print head by means of an image evaluation, the print head is subsequently moved and/or rotated on the surface of the support (paddle; printing table) about its Z axis about the angle γ in the direction of the Y axis until its position corresponds with the captured position of the substrate (wafer), the continuous measurement of the distance between the distance sensors, which advance ahead of the pressure nozzle, and the surface of the substrate (wafer) is started and the obtained measuring data are supplied to a process actuator for starting the advance of the print head in the direction of the X axis (printing direction), wherein the print head is advanced in a controlled manner in the direction of its X axis via a feedback of the output of the process actuator to the input thereof until the distance sensor, which advances ahead of the pressure nozzle, has captured the first flange of the substrate (wafer), which is positioned on the surface of the support (paddle; printing table), the operation of the pressure nozzle (printing process) is then started while continuing the advance of the print head in the direction of the X axis (printing direction) and during a continuous measurement of the distance between the distance sensors advancing ahead of the pressure nozzle and the surface of the substrate (wafer) and the obtained distance measuring values are continuously compared with the predetermined (defined) distance values by means of a signal comparator, wherein, in response to an i.O. signal at the output of the signal comparator, the advance of the print head in the direction of the X axis is continuously continued via a feedback to the input of the process actuator in the direction of the X axis (printing direction) and in response to a n.i.O. signal at the output of the signal comparator, the print head is always adjusted in the direction of the Z axis via a drive, which corresponds to the n.i.O. signal and/or is inclined about the X axis and is further advanced in the direction of the X axis (printing direction), until the second flange of the substrate (wafer), which is positioned on the support (paddle) and which is to be imprinted, is captured by the distance sensors, which advance ahead of the pressure nozzle, whereupon the operation of the pressure nozzle of the print head (the printing process) is ended.

Preferably, the distance sensors capture the respective distance between the print head and the surface of the substrate (wafer) by means of laser triangulation, inferometrically, acoustically, chromatically confocally, capacitively, inductively and/or on any other electric base.

The distance sensors can be queried analogously or at discrete points at certain times (digitally) by means of the signal comparator. Inaccuracies in the mechanical attachment of the print head and/or positional errors, thermal expansions and/or mechanical deformations of the wafer can also be advantageously determined by balancing the measuring values captured by the distance sensors with predetermined corresponding setpoint values, which are stored in the signal comparator, and which are compensated by a subsequent corresponding drive of the process actuators at the respective print head. One-dimensional or two-dimensional process actuators are to be used for the alignment of the process head (print head).

Preferably, the measurement of the distance between the print head and the printing unit, respectively, and the surface of the substrate (wafer), are carried out by means of the distance sensors and the control of the corresponding positioning of the print head takes place in an online manner. Preferably, the control of the positioning of the print head is carried out by means of a robot, such as, e.g., a hexapod.

Advantageously, the calibration of the distance sensors and the control of the process actuators is carried out according to a calibrating routine, according to which provision is to be made for two upper distance sensors at the respective print head in such a manner that the connecting line thereof does not point in the direction of movement of the process (printing direction), that the two measuring points have two parallel lines during the movement of the print head in response to the measurement of the distance to the substrate surface and that two lower sensors are to be arranged next to the substrate (wafer) in such a manner that the print head is to be positioned above the lower sensors in two positions A and B, wherein the distances between the two upper and the two lower distance sensors are measured in the first position A and the distances between the two lower sensors and the pressure nozzles of the print head are measured in the second position B.

Prior to the printing process, the substrate surface (wafer surface) must be known. Initially, a calibration thus takes place. For this purpose, the four distances of the two upper sensors and the distances of the print head to the two lower sensors are measured for this purpose in position A and B of the print head. The differences result in a height offset of the print head when a substrate (wafer) or a worknest surface is measured with the supper sensors. Due to the fact that each wafer encompasses an individual thickness and thickness variation (wedge shape), these values are determined by each wafer ahead of time by means of a suitable measuring device.

At the onset of the method, which is carried out according to the above-mentioned calibrating routine, the calibration of the distance sensors is initially carried out at a fixed distance to the calibrating section. At the same time, the vertical distance between a sensor and the assigned pressure nozzle of the print head is measured externally. The respective measuring values from the calibration and from the external measurement of the vertical distance between distance sensor and pressure nozzle of the print head are supplied to an evaluation unit, which determines the position of the pressure nozzle of the print head to the distance sensors, whereby the calibrating process is ended.

Preferably, the print head is moved in the direction of the printing movement so as to be mounted at an alignment handling, which is formed from a plurality of metal plates, which are arranged parallel to one another and on top of one another, the uppermost metal plate of which is fixed so as to be immovable, wherein two adjacent metal plates are in each case connected via guides, arbors and motors in terms of function in such a manner that the respectively lower metal plate is to be moved with at least one degree of freedom (displacements x, y, z and rotations $\phi$, $\theta$) in addition to the degrees of freedom of the upper metal plate and that the print head is thus to be positioned freely in the space in up to six degrees of freedom, wherein the direction of the printing movement (x) is provided as the sole degree of freedom for the lowermost metal plate.

Suitably, the individual thickness and thickness variations (wedge shape) and/or the geometric surface structure of the thin substrate (wafer), which is to be imprinted, is initially determined by means of a thickness and thickness variation measuring device and/or topography measuring system, whereupon the section of the substrate (wafer) surface is clearly determined by the calibration of the printing unit, which was carried out previously, and by depositing the substrate (wafer), the print head is oriented in all directions, except for the printing direction x, in such a manner that the subsequent movements of the print head in the printing direction x describe the section of the surface of the substrate (wafer) at a defined printing distance, wherein the print head is first lifted from the substrate (wafer), is aligned and is moved into the initial x position and is again moved into the required distance to the surface of the substrate (wafer) prior to the printing movement.

The object of the invention is also solved by means of a device comprising at least one print head being characterized by an alignment handling, which mounts the print head in a movable manner and which is formed from a plurality of metal plates, which are mounted parallel on top of one another, the uppermost metal plate of which is fixed so as to be immovable, wherein the respectively lower metal plate is to be moved with one or a plurality of degrees of freedom (displacements x, y, z and rotations $\phi$, $\theta$) in addition to the degrees of freedom of the upper metal plate by means of guides, arbors and motors, which are provided in each case between two adjacent metal plates and the print head is thus to be positioned freely in the space in up to six degrees of freedom and the direction of the printing movement (x) is included in the lowermost metal plate as the sole degree of freedom.

The method according to the invention and the device according to the invention for carrying out said method enable a reliable and continuous control and regulation of the positioning and/or guide of at least one process head (print head and/or of a printing unit for the metallization (imprinting) of substrates such as wafers at a defined distance above the surface of the substrate (wafer) in a time-saving manner, wherein the distance of the process head (print head) to the substrate surface (wafer surface) is determined during the printing by means of the upper distance sensors. If a parameter changes during a printing series, the determination of this change and a corresponding adaptation of the alignment coordinates of the process head (print head) are given immediately.

BRIEF DESCRIPTION OF THE DRAWINGS

The invention will now be defined by means of the drawings.

DETAILED DESCRIPTION

A first embodiment of the method for positioning and/or guiding at least one arbitrary process head (print head) or a printing unit comprising at least one pressure nozzle for the metallization (imprinting) of thin substrates such as wafers at a defined distance above the surface of the substrate (wafer), which is to be provided on a support (paddle; printing table), is now described with reference to FIGS. 1a, 1b, 3, 4a, 4b, 4c, 7 and 8.

Figure 3:
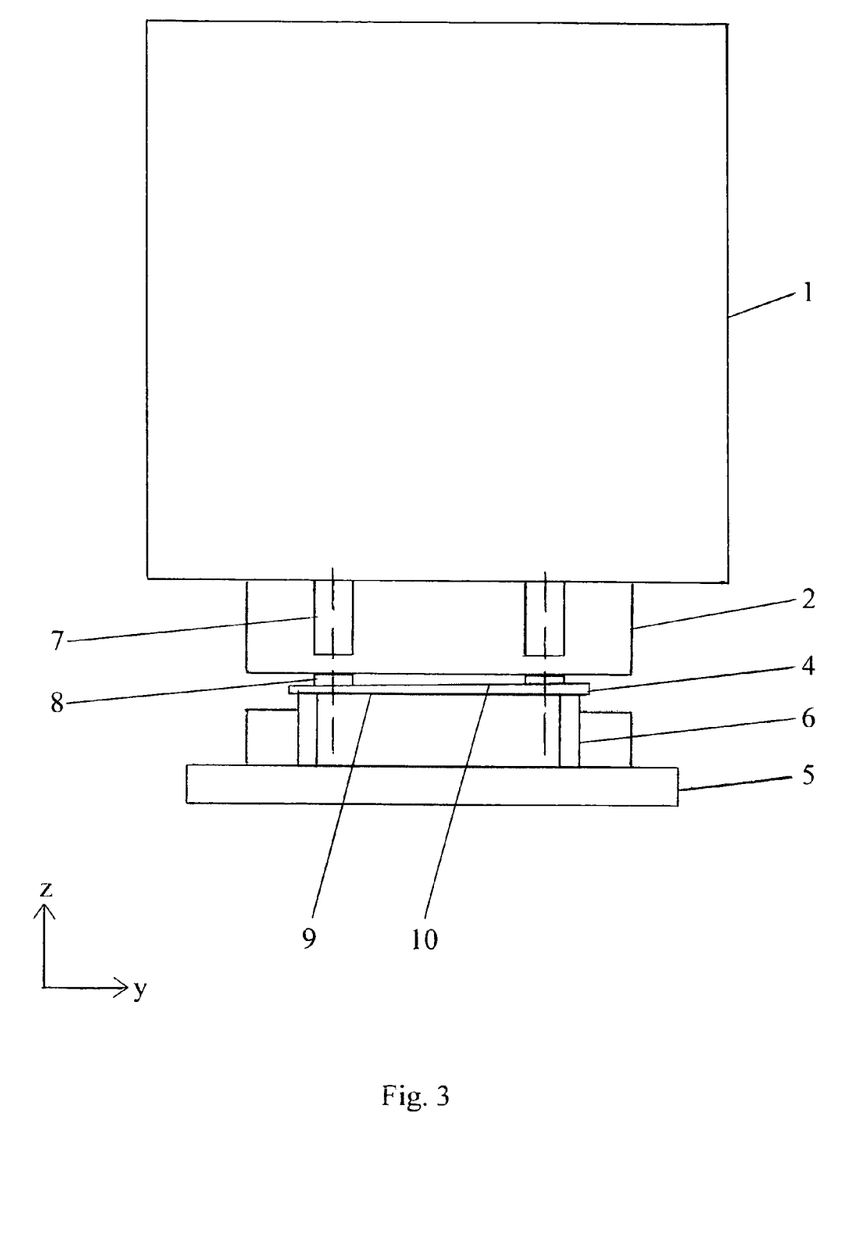
FIG. 3 shows a front view (section Z-Y) of a schematically illustrated print head for use in a first embodiment of the method.
Figure 4A:
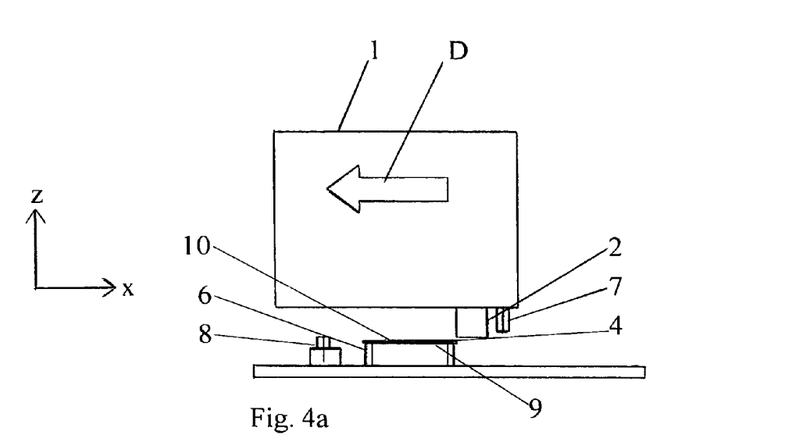
FIGS. 4a to 4c show schematic illustrations in the Z-X section of the print head used in the first embodiment of the method in consecutive stages of its movement in printing direction D.
Figure 4B:
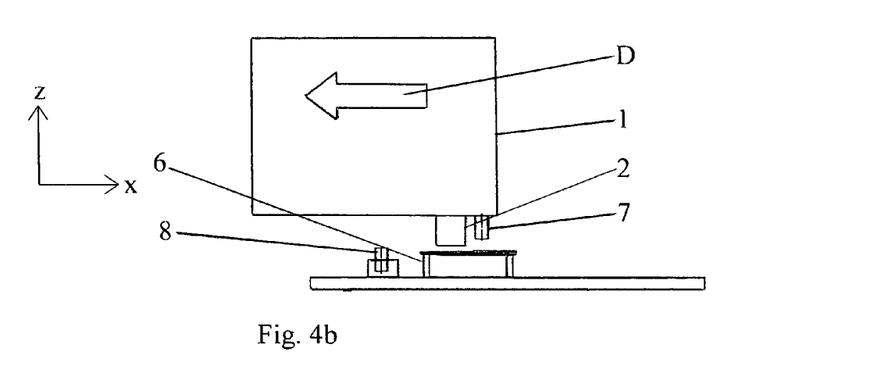
Figure 4C:
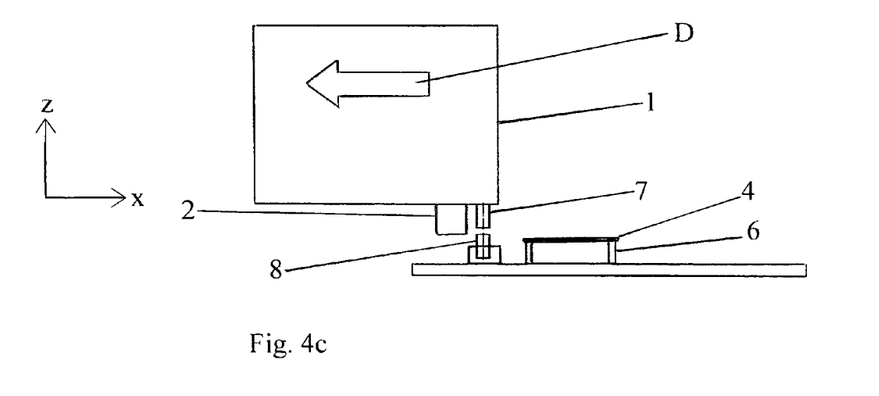

FIG. 3 shows, schematically in a side view, a print head 1 in the section Z;Y, which is mounted on an alignment handling, which is not shown in FIG. 3, and which can be moved together with said alignment handling by means of a robot comprising three degrees of translational freedom and three degrees of rotational freedom. The print head 1 encompasses a pressure nozzle 2 at its lower surface 3, which is to be aligned to a wafer 4 having a typically wedge-shaped form and said wafer is to be positioned on a wafer holder located on a table top 5 or on a support 6 at a distance to the section of the opening of the pressure nozzle 2. Provision is made on the lower surface 3 of the print head 1 and oppositely at the wafer holder 6 for upper and lower distance sensors 7 and 8, respectively, so as to be assigned to one another, wherein the upper distance sensors 7 are positioned in printing direction (arrow D) of the pressure nozzle 2 arranged downstream at the print head 1, as can be seen from FIGS. 4a to 4c, which show the print head 1 in the Z-X section in three consecutive stages of the movement in printing direction (arrow D), i.e., when reaching a first flange $K_1$ of the wafer 4 (FIG. 4a), which is positioned on the surface 9 of the support 6, in printing position above the surface 10 of the wafer 4 (FIG. 4b), which is positioned on the surface 9 of the support 6, and after the surface 10 of the wafer 4 (FIG. 4c), which is positioned on the surface 9 of the support 6, has been imprinted.

Figure 1A:
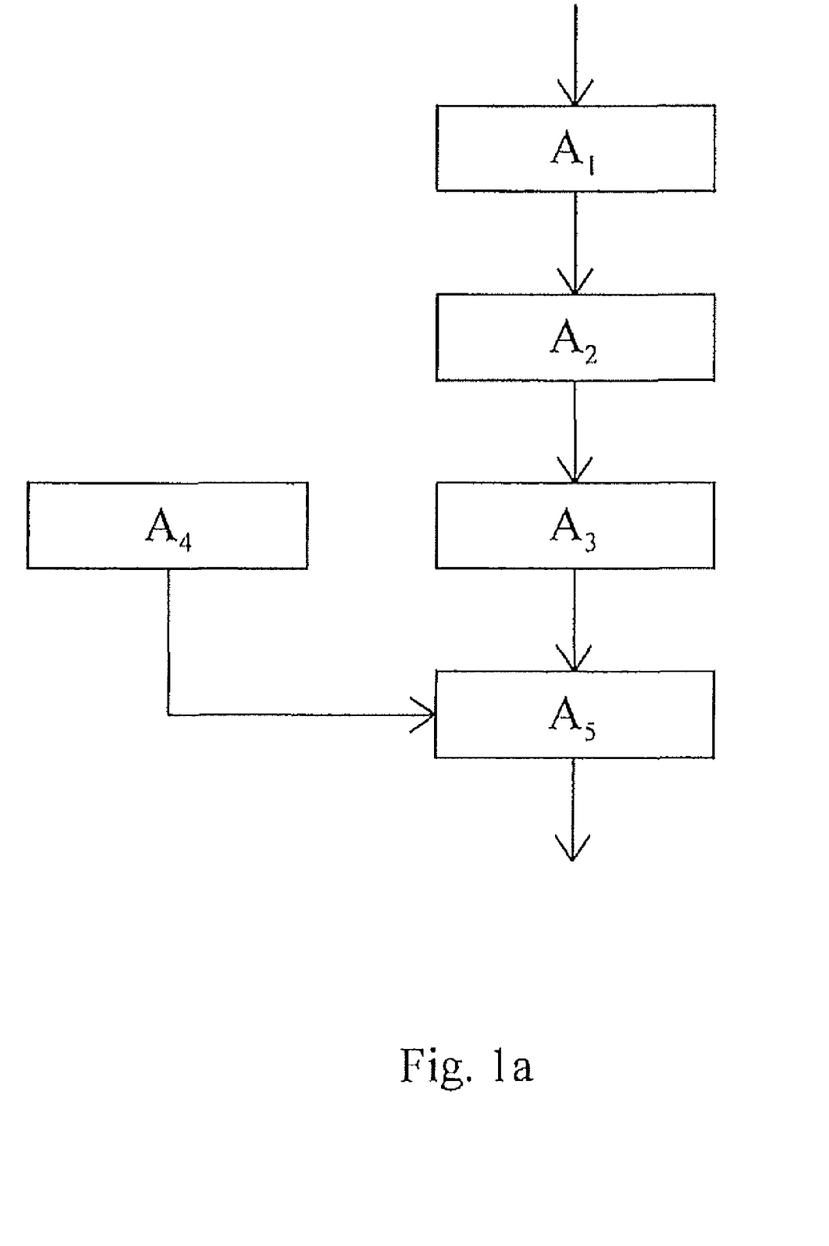
FIGS. 1a and 1b show flow charts of the consecutive method steps of a first embodiment of the method.
Figure 1B:
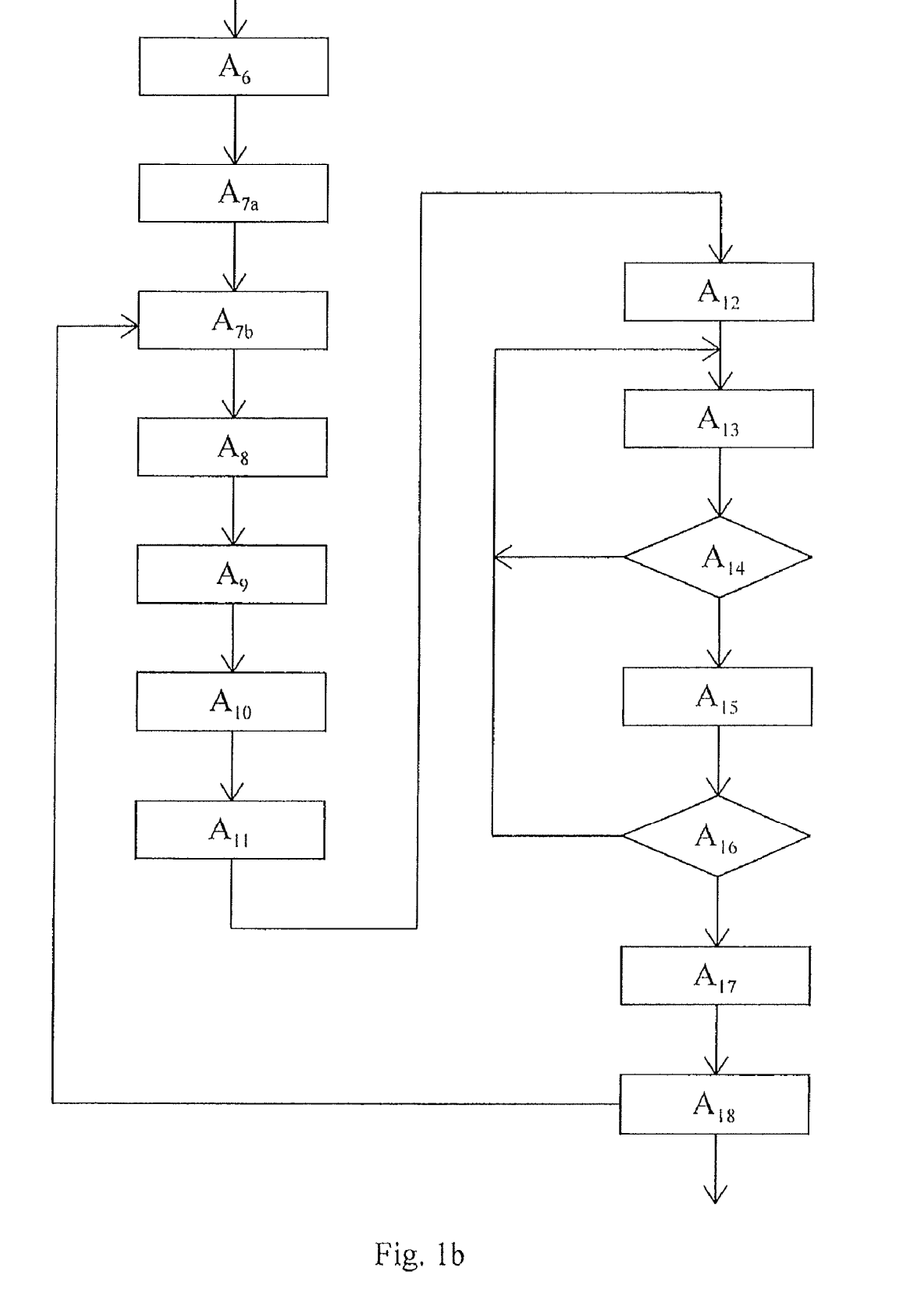

As can be seen from the flow charts shown in FIGS. 1a and 1b, the following method steps $A_1$-$A_{18}$ are carried out consecutively so as to adjust the section of the opening of the pressure nozzle 2 of the print head 1 to the surface 10 of the wafer 4, which is positioned on the surface 9 of the support 6, so as to be coplanar and so as to maintain the coplanar position during the printing process:

$A_1$ and $A_2$: The upper and lower distance sensors 7, which are to be positioned in pairs on the print head 1 and on the support 6 for the wafers 2, are initially calibrated according to a calibrating routine, according to which the distance between the upper and lower distance sensors 7 and 8, respectively, which are arranged in pairs, is determined in a standard manner by means of a standard body.

Figure 5:
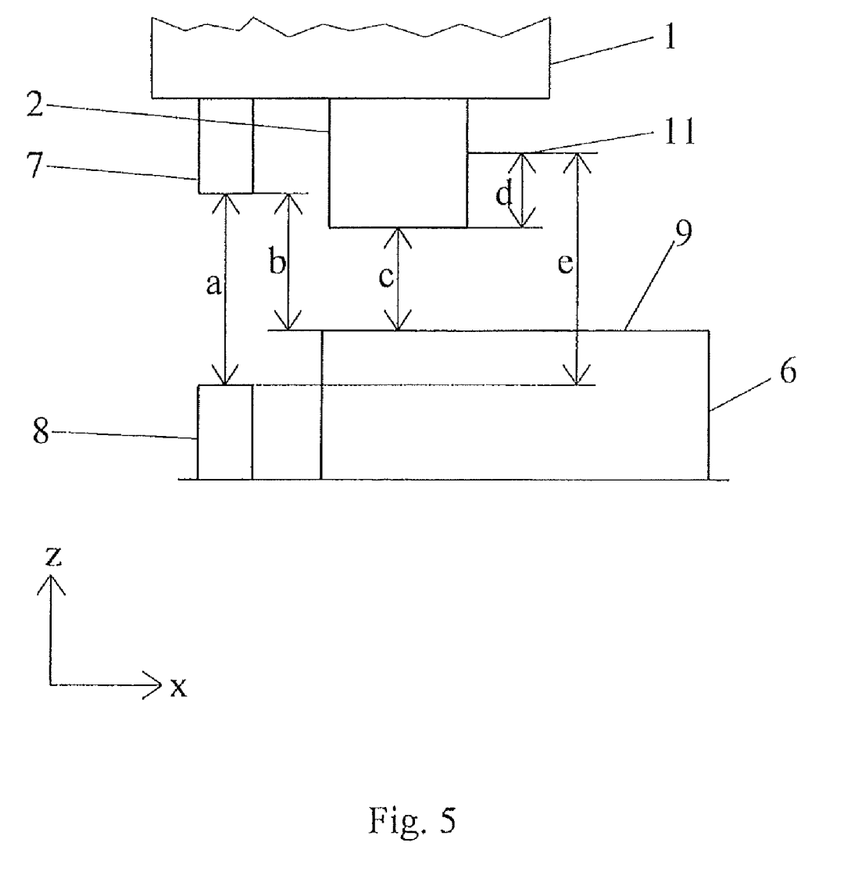
FIG. 5 shows a schematic illustration of the print head, which is to be used in the first embodiment of the method comprising a predetermined reference plate for determining the distance between the section of the distance sensors at the print head and the section of the opening of the pressure nozzle of the print head.

$A_3$: The inclination of the surface 9 of the support 6 for the wafer 2 is then determined by means of the distance sensors 7 and 8, respectively, and $A_4$: as can be seen from FIG. 5, the distance d between a reference plate 11 provided at the print head 1 and the section of the opening of the pressure nozzle 2 is determined at the same time, i.e., via the distance a between the upper and lower distance sensors 7 and 8, respectively, the distance b between the upper distance sensors and the surface 9 of the support 6, the distance c between the section of the opening of the pressure nozzle 2 and the surface 9 of the support 6 and via the distance e between the reference plate 11 at the print head 1 and the lower distance sensors 8.

$A_5$: The position of the pressure nozzle 2 with reference to the surface 9 of the support 6 is determined subsequently via the distance between the reference plate 11 at the print head 1 and the section of the opening of the pressure nozzle 2 and via the angle of inclination of the surface 9 of the support 6 for the wafer 4.

$A_6$: The thickness and the thickness variations (wedge shape) of the wafer 2, which is to be imprinted, are then determined by means of a thickness and thickness variation measuring device.

$A_{7a}$ and $A_{7b}$: After positioning the wafer 4 on the surface 9 of the support 6, the section of the surface 10 of the wafer 4, which is to be imprinted, is then determined in the space via the already determined section of the surface 9 of the support 6 in the space and via the previously determined geometry of the wafer 4.

$A_8$: The print head 1 is subsequently rotated about is X and/or Y axis by means of a process actuator 12 until the section of the opening of the pressure nozzle 2 is adjusted so as to be coplanar to the section of the surface 10 of the wafer 4, which is to be imprinted.

Figure 6:
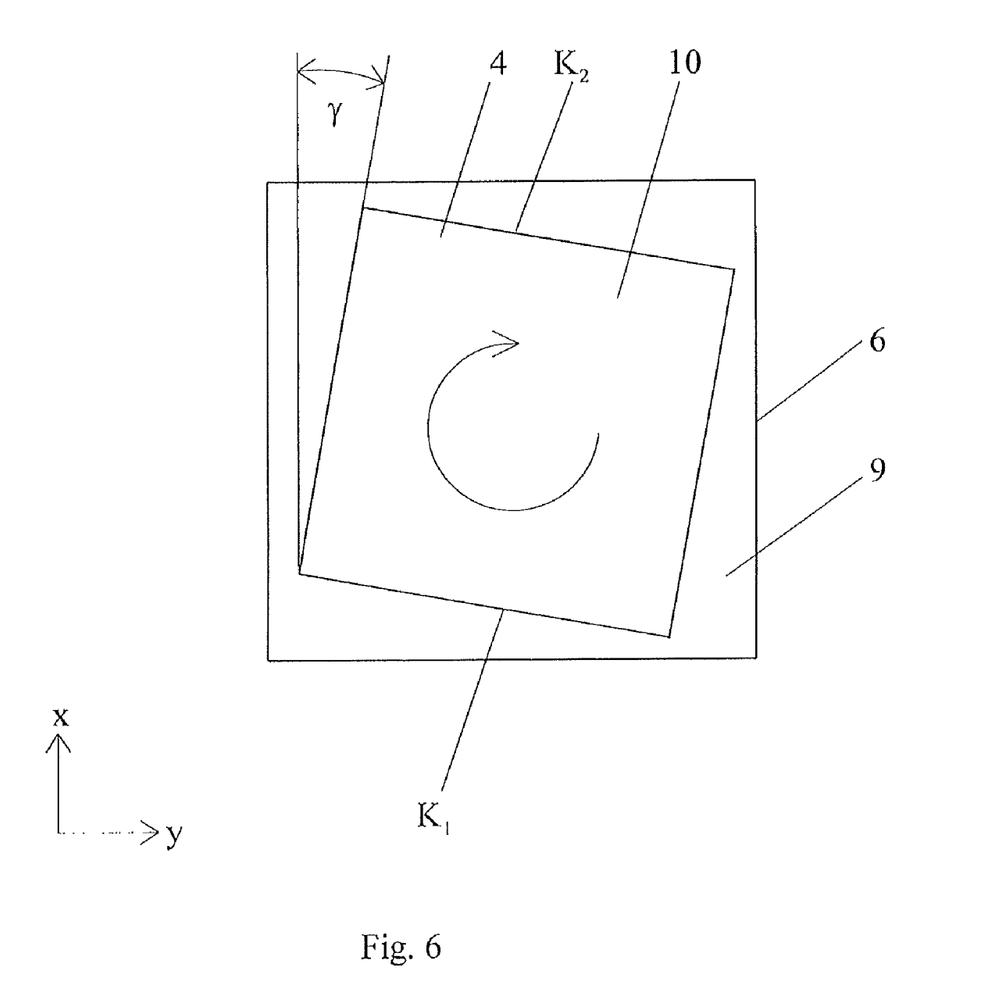
FIG. 6 shows a top view of a schematic illustration of the position of a wedge-shaped wafer, which is positioned on the surface of a support, and which is to be captured pictorially.

$A_9$: The two-dimensional arrangement of the wafer 4 illustrated in FIG. 6, which is positioned on the surface 9 of the support 6 and which is to be imprinted, is subsequently captured pictorially by means of a camera.

$A_{10}$: The wafer length, width and the angle γ of the rotation of the wafer position on the surface 9 of the support 6 with reference to the Z axis of the print head 1 are then determined by means of an image evaluation.

$A_{11}$: The print head 1 is rotated subsequently about its Z axis according to the determined angle of rotation γ by means of a process actuator.

$A_{12}$: The distance between the section of the opening of the pressure nozzle 2 and the surface 10 of the wafer 4, which is to be imprinted, is then continuously measured by means of the upper distance sensors 7 provided at the print head 1.

$A_{13}$: The respective measuring data are subsequently input into the process actuator for starting the forward movement of the print head 1 in the direction of the X axis (printing direction).

$A_{14}$: The print head 1 is continuously advanced via a feedback from the output of the process actuator to the input thereof in the direction of the X axis (printing direction) until the pressure nozzle 2 has reached an initial printing position 14 (FIG. 3A), which is defined by the previously determined position of the first flange $K_1$ of the wafer 4, which is positioned on the surface 9 of the support 6.

$A_{15}$: The operation of the pressure nozzle 2 is started by means of the process actuator in the initial printing position.

$A_{16}$: The advance of the print head 1 in the direction of the X axis (printing direction) and thus the operation of the pressure nozzle 2 is maintained via a feedback of the output of the process actuator to the input thereof until a final printing position is reached, which is defined by the previously determined position of the second flange $K_2$ of the wafer 4, which is positioned on the surface 9 of the support 6, in which the process actuator turns off the operation of the pressure nozzle 2.

$A_{17}$: The process is subsequently ended immediately $A_{18}$: or only when, after the pressure nozzle 2 was turned off and thus after the surface 12 of the wafer 4 was imprinted, the determination of the section of the surface of a wafer, which is to be imprinted subsequently, has been carried out via the section of the surface 9 of the support 10, which is to be determined again, and when the evaluation of the thickness and thickness variation measurement of the wafer, which is to be imprinted subsequently, has been carried out.

Figure 7:
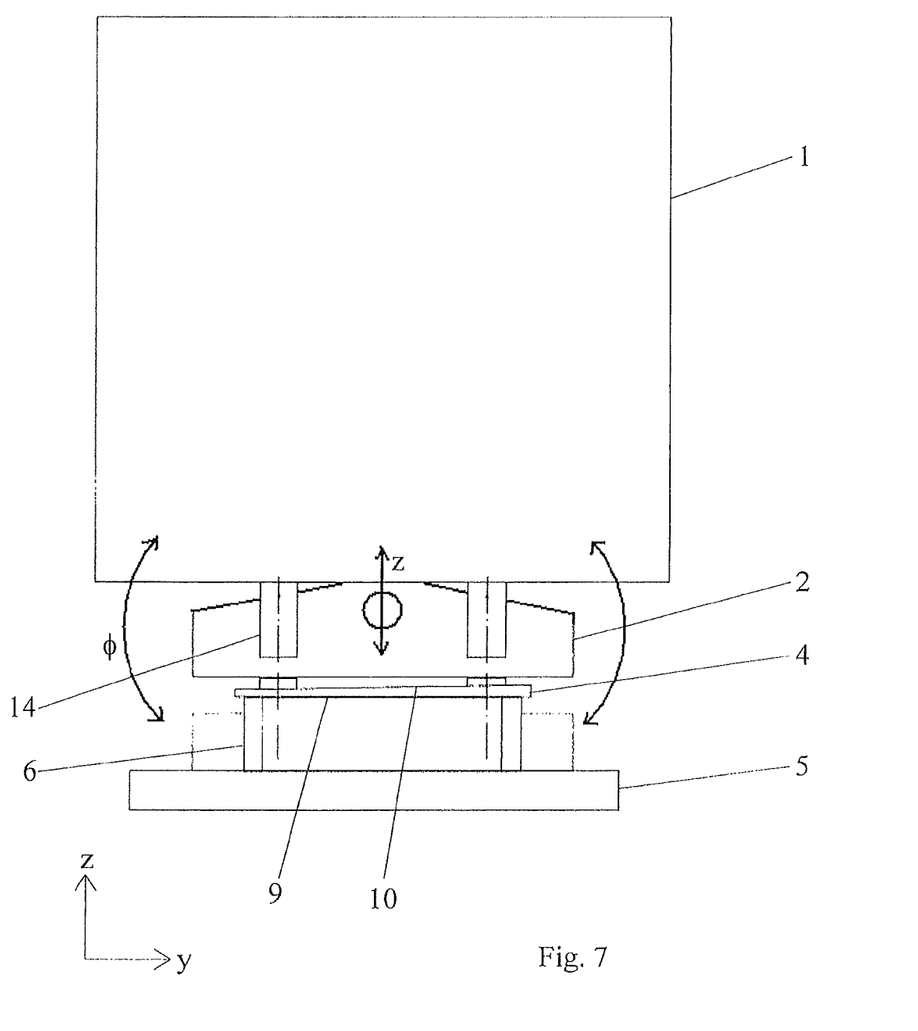
FIG. 7 shows a front view corresponding to that of FIG. 3 in the Z-Y section of a schematically illustrated print head, which, however, is provided for the use in the second embodiment of the method.
Figure 8A:
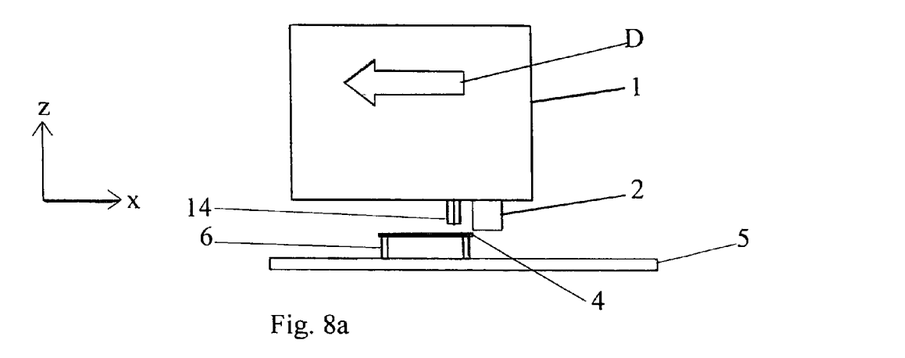
FIGS. 8a to 8c show schematic illustrations corresponding to those in FIGS. 3 a to 3 c in the Z-Y section, wherein the print head according to FIG. 7, which is used in the second embodiment of the method, is illustrated in consecutive stages of its movement in printing direction (arrow D)
Figure 8B:
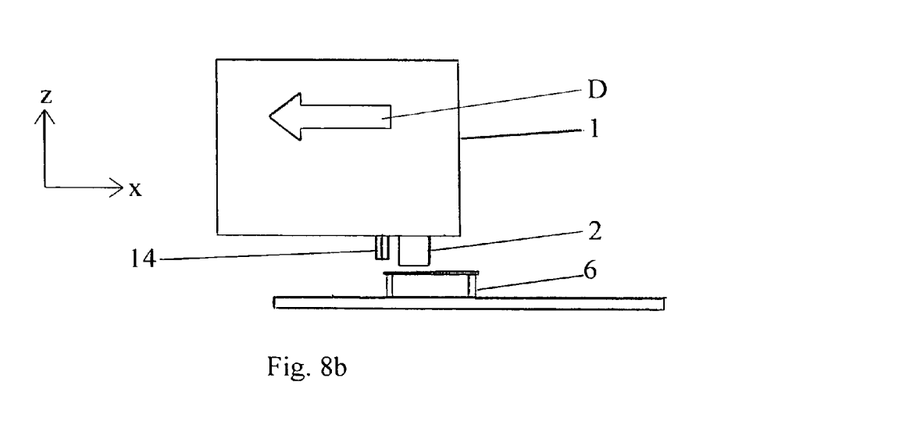
Figure 8C:
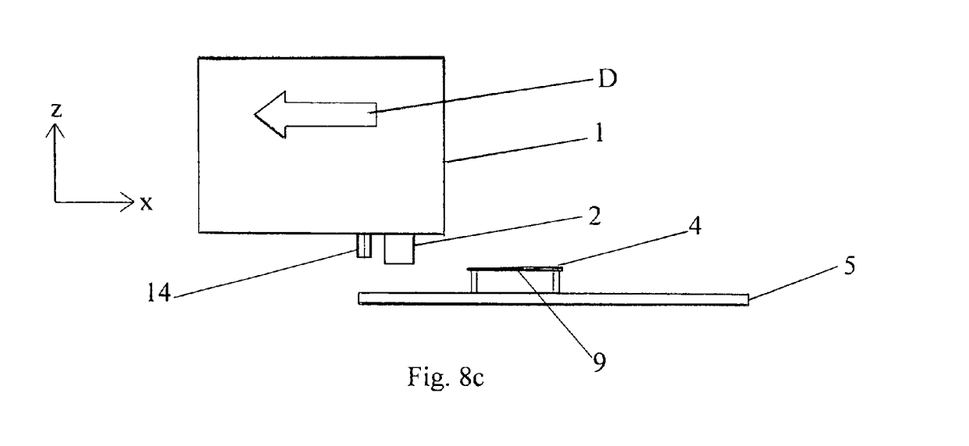

FIG. 7 shows a front view of the print head 1 in the Z-Y section, which corresponds to that of FIG. 3, where the second embodiment of the method is used. As can be seen in FIGS. 8a to 8c, which show the print head 1 in the Z-X section in three consecutive stages of the movement in printing direction (arrow D) in accordance with FIGS. 4a to 4c, the distance sensors 15 provided here at the print head are positioned in printing direction (arrow D) upstream of the pressure nozzle 2.

Figure 2A:
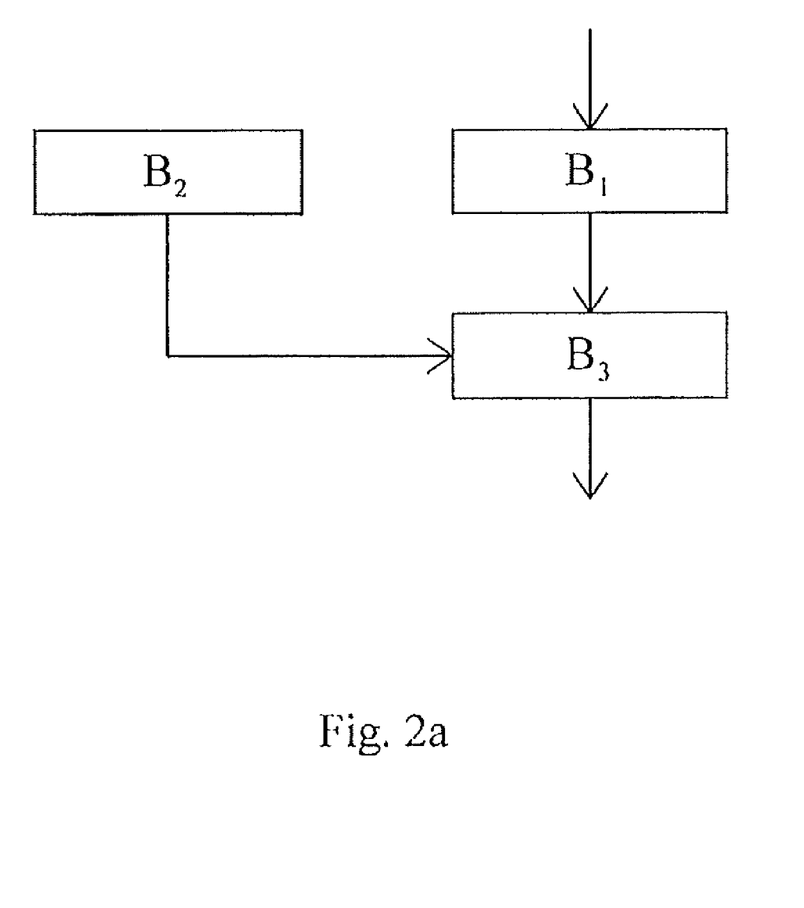
FIGS. 2a and 2b show flow charts of the consecutive method steps of a second embodiment of the method.
Figure 2B:
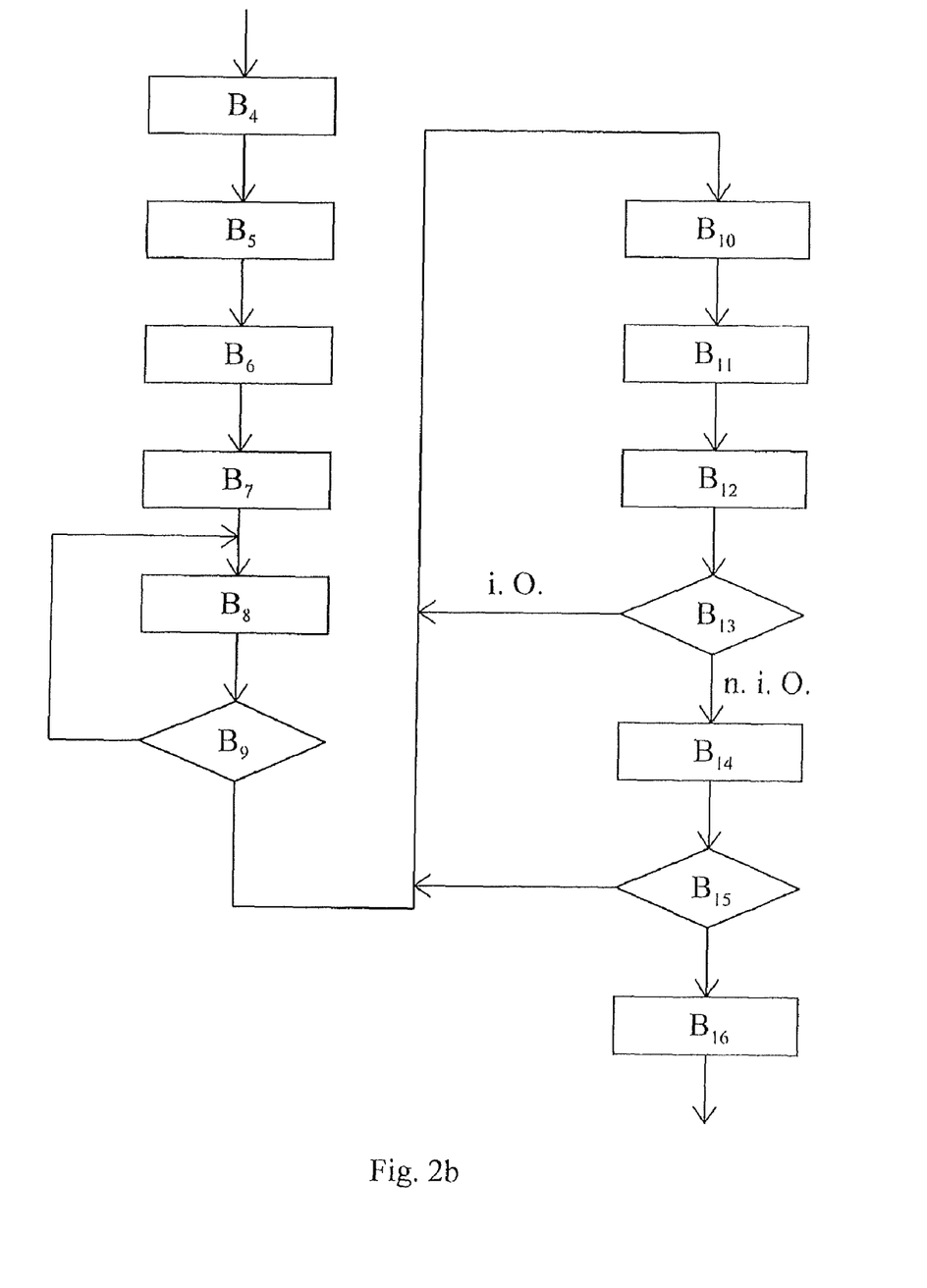

As is shown in the flow charts shown in FIGS. 2a and 2b, the following method steps $B_1$ to $B_{16}$ are carried out consecutively so as to adjust the section of the opening of the pressure nozzle 2 of the print head 1 to the surface 10 of the wafer 4, which is positioned on the surface 9 of the support 6, so as to be coplanar and so as to maintain the coplanar position during the guiding of the print head across the surface 10 of the wafer 4, which is to be imprinted, and/or so as to again adjust said section in response to deviations:

$B_1$: The distance sensors 14, which are to be provided in each case at the print head 1 in printing direction (arrow D)

upstream of the pressure nozzle 2 are initially calibrated at a fixed distance to a predetermined calibrating section;

$B_2$: the predetermined vertical distance between the section of the distance sensors 14 and the section of the opening of the pressure nozzle 2 are introduced into the method at the same time.

$B_3$: The section of the opening of the pressure nozzle 2 in the space to the distance sensors 14 at the print head 1 is determined subsequently via the measured vertical distance between the section of the distance sensors 14 and the section of the opening of the pressure nozzle 2 and via the fixed distance of the distance sensors 14 to the predetermined calibrating section.

$B_4$: The two-dimensional arrangement of the wafer 4, which is to be imprinted and which is positioned on the surface 9 of the support 6, is then captured pictorially by means of a camera.

$B_5$: The wafer length, width and the angle γ of the rotation of the wafer position on the surface 9 of the support 6 are then determined with reference to the Z axis of the print head 1 by means of an image evaluation.

$B_6$: The print head 1 is then moved in the direction of the Y axis until its position corresponds with the captured position of the wafer 4 on the surface 9 of the support 6 and is simultaneously rotated about its Z axis about the angle γ.

$B_7$: The continuous measurement of the distance between the distance sensors 14 positioned in printing direction (arrow D) upstream of the pressure nozzle 2 at the print head 1 and the surface 10 of the wafer 4, which is to be imprinted, is subsequently initiated.

$B_8$: The obtained measuring data are supplied to a process actuator for starting the advance of the print head 1 in the direction of the X axis (printing direction).

$B_9$: The print head 1 is advanced via a feedback of the output of the process actuator to the input thereof in the direction of the X axis in a control manner until the distance sensors 14, which advance ahead of the pressure nozzle, have captured the first flange $K_1$ of the wafer 4, which is positioned on the surface 9 of the support 6, at the print head 1.

$B_{10}$: The advance of the print head 1 in the direction of the X axis (printing direction) is continued at the same time and $B_{11}$: the operation of the pressure nozzle 2 is started, $B_{12}$: wherein the continuous measurement of the distance between the distance sensors 15 at the print head 1, which advance ahead of the pressure nozzle 2, and the surface 10 of the wafer, which is to be imprinted, is continued.

$B_{13}$: The obtained distance measuring values are continuously compared with the predetermined (defined) distance values in a signal comparator, wherein, in response to an i.O. signal at the output of the signal comparator, the advance of the print head 1 in the direction of the X axis is continued in a continuously controlled manner via a feedback of the output of the process actuator to the input thereof.

$B_{14}$: In response to a n.i.O. signal at the output of the signal comparator, the print head is always adjusted via a drive in the direction of the Z axis and/or is correspondingly inclined about the X axis before the print head 1 is further advanced in the direction of the X axis.

$B_{15}$: The advance of the print head 1 in the direction of the X axis is carried out continuously via a feedback to the input of the process actuator, provided that the second flange $K_2$ of the wafer 4, which is positioned on the surface 9 of the support 6, is not captured by the distance sensors 14, which advance ahead of the pressure nozzle 2 in printing direction (arrow D).

$B_{16}$: The operation of the pressure nozzle 2 is turned off and the printing process is thus ended when the second flange $K_2$ of the imprinted wafer 4, which is positioned on the surface 9 of the support 6, is captured by means of the distance sensors 14 at the print head 1, which advance ahead of the pressure nozzle 2 in printing direction (arrow D).

Figure 9:
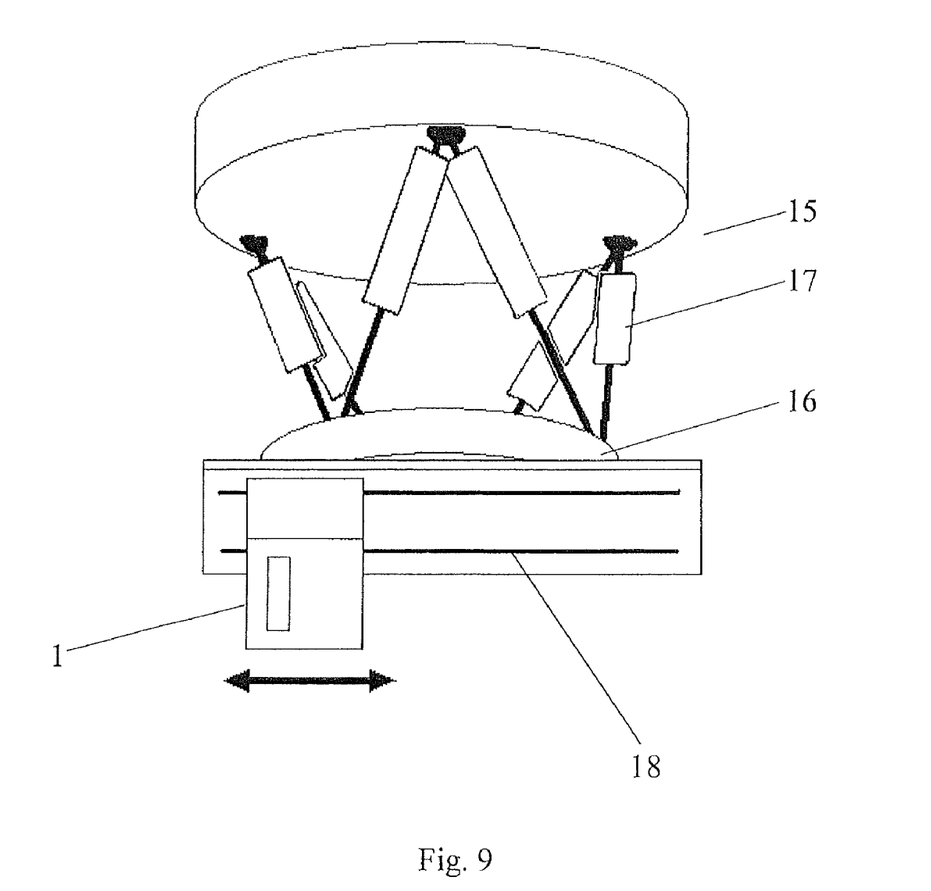
FIG. 9 shows a schematic perspective illustration of a robot in the form of a hexapod comprising a print head mounted thereon and FIG. 10 shows a schematic perspective view of an alignment handling, which consists of a plurality of parallel metal plates, which are arranged on top of one another, wherein a print head is mounted on the lowermost metal plate.

FIG. 9 shows, schematically, a robot 15 comprising a parallel kinematics, a so-called hexapod, for controlling the translatory and arbitrarily rotational movement of the print head 1. This robot 15 can position the working surface 16, e.g., a small plate-like disk, in all 6 degrees of freedom in that actuators 17, which are formed by electric cylinders, for example, are extended and retracted in a known manner. To attain a large lift in X axis, the working surface 16 of the robot 15 can be mounted on a linear axis 18, along which the robot 15 is to be moved for imprinting the wafer 4 and for moving the pressure nozzle 2 into a cleaning station. Position adjustments of the print head 1 by means of the robot 15 are then possible in the Y and in the Z axis as well as in the 3 degrees of rotational freedom. The printing movement of the print head 1 is to be carried out in an extremely smooth manner by means of the linear axis 18.

Figure 10:
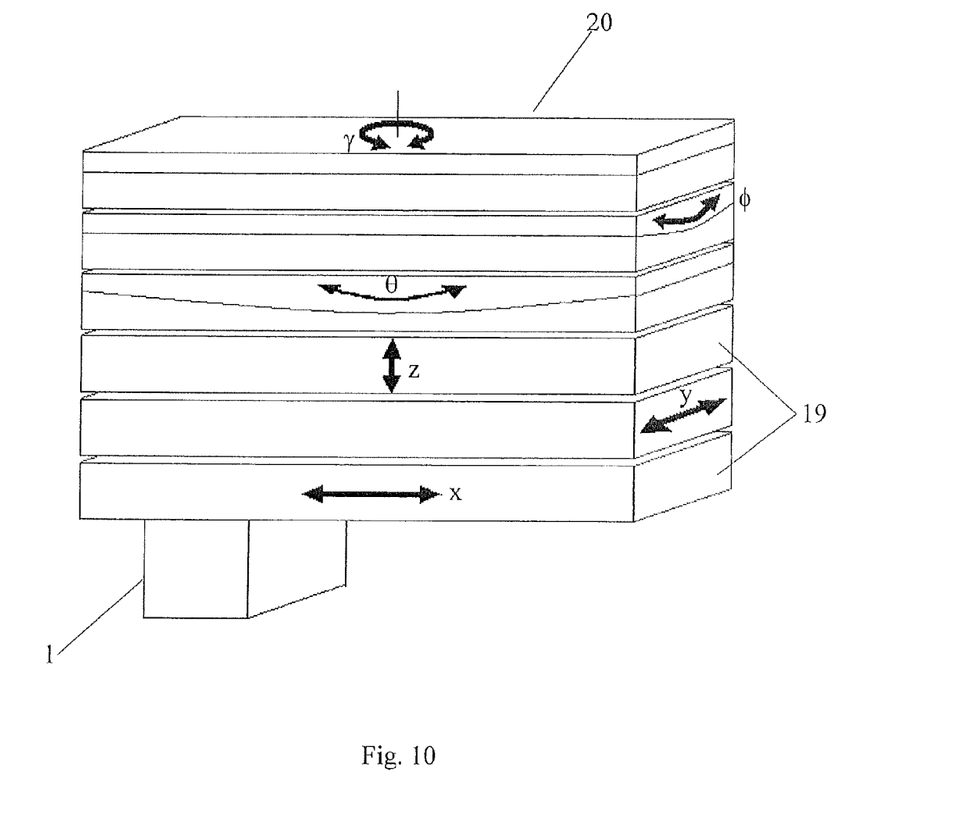

FIG. 10 shows, schematically, an alignment handling 20 formed from a plurality of parallel metal plates 19, which are arranged on top of one another, on the lowermost metal plate 19 of which the print head 1 is mounted. The uppermost metal plate 19 is fixed so as to be immovable and two adjacent metal plates 19 are in each case connected via guides, arbors and motors in terms of function in such a manner that the respectively lower metal plate 19 is to be moved with at least one degree of freedom (displacements in X, Y and Z axis and rotations ϕ, θ) in addition to the degrees of freedom of the upper metal plate 19. The print head 1 mounted on the alignment handling 20 is thus to be positioned freely in the space in up to six degrees of freedom, wherein the direction of the printing movement x (arrow D) is provided as the sole degree of freedom for the lowermost metal plate 19.

REFERENCE LIST $A_1$ to $A_{17}$ method steps of the first embodiment of the method
$B_1$ to $B_{18}$ method steps of the second embodiment of the method
1 print head
2 pressure nozzle
3 lower surface of the print head
4 substrate, wafer (wedge-shaped)
5 table top
6 support; wafer holder
7 upper distance sensors at the print head in printing direction D arranged downstream from the pressure nozzle
8 lower distance sensors at the support
9 surface of the support
10 surface of the wafer, which is to be imprinted
11 reference plate at the print head
12 process actuator
13 initial printing position
14 distance sensors at the print head in printing direction D upstream of the pressure nozzle
15 robot; hexapod
16 working surface of the robot; small plate-like disk
17 actuators; electric cylinders
18 linear axis for working surface 16
19 metal plates
20 alignment handling
Arrow D printing direction
γ angle of the rotation of the wafer, which is positioned on the surface of the support, about the Z axis x,y,z translatory degrees of freedom, movement axes of the print head φ, θ, γ rotational degrees of freedom $K_1$; $K_2$ flanges of the wafer, which is positioned on the surface of the support

The invention claimed is:

1. A method for positioning and guiding a print head, comprising:

providing a support for a substrate, said support having a surface;

providing said substrate on said support; said substrate having a multi-dimensional arrangement;

providing a nozzle on said print head, said nozzle being capable of imprinting thin substrates, said nozzle being provided at a defined distance above said surface of said substrate, said nozzle having an opening, said opening defining a plane, said plane of said opening of said nozzle being adjusted so as to be coplanar to said surface of said substrate, said coplanar adjustment being maintained during the printing processes;

positioning at least one upper distance sensor on said print head;

calibrating said at least one upper distance sensor on said print head;

determining the incline of said surface of said support and a distance between a reference plane predetermined on said print head and said plane of said opening of said nozzle by means of said at least one upper distance sensor, the position of said nozzle to said surface of said support being determined by measuring the distance between the reference plate of said print head and said plane of said opening of said nozzle and measuring the angle of inclination of said surface of said support;

capturing said multi-dimensional arrangement of said substrate in an image by means of a camera;

determining substrate length, width and angle of rotation of the position of said substrate on said surface of said support to a Z-axis of said print head by means of an image evaluation;

rotating said print head according to said determined angle of rotation about said Z-axis;

measuring on a repeating basis the distance between said plane of said opening of said nozzle and said surface of said substrate to obtain measurement data, said measuring being achieved by means of said at least one upper distance sensor;

inputting said measuring data into a process actuator for starting a forward motion of said print head in a direction of a printing direction;

wherein operation of said nozzle is started by means of said process actuator;

wherein said print head is moved forward continuously in said direction of said printing direction by means of feedback from an output of said process actuator to an input of said process actuator until said nozzle has reached an initial printing position, said initial printing position being defined by means of a previously determined position of a first flange of said substrate positioned on said support; and wherein said print head is continued in said direction of said printing direction by means of said feedback of said output of said process actuator to said input of the process actuator until a final printing position has been reached, which is defined by a previously determined position of a second flange of said substrate, and wherein said process actuator turns off operation of said nozzle and said process is ended.

2. The method according to claim 1, wherein said at least one upper distance sensor capture the respective distance, and said distance is measured by a means selected from the group consisting of laser triangulation, inferometrically, acoustically, chromatically confocally, capacitively, inductively and an electronic means.

3. The method according to claim 1, wherein said at least one upper distance sensor are queried by a method selected from the group consisting of analogously and at discrete points at certain times by means of the signal comparator.

4. The method according to claim 1, wherein inaccuracies in the mechanical attachment of said print head and/or positional errors, thermal expansions and/or mechanical deformations of the wafer can be determined by balancing the measuring values captured by said at least one upper distance sensor with predetermined corresponding setpoint values, and wherein said setpoint values are stored in said signal comparator and wherein said inaccuracies, errors, expansions, and deformations are compensated by a subsequent corresponding drive of the process actuators at the respective print head.

5. The method according to claim 1, wherein one-dimensional or two-dimensional process actuators are used for the alignment of the print head.

6. The method according to claim 1, wherein the measurement of said distance between said print head and said surface of said substrate is achieved by means of said at least one upper distance sensor and wherein control of the corresponding positions of said print head and said surface takes place in an online manner.

7. The method according to claim 1, wherein the adjustment movements of said print head are carried out by means of a robot.

8. The method according to claim 1, wherein the calibration of said at least one upper distance sensor and control of said process actuators is carried out according to a calibrating routine according to which provision is made for two upper distance sensors at said print head in such a manner that a connecting line thereof does not point in the direction of movement of said printing direction, wherein two measuring points describe two parallel lines during the movement of said print head in response to the measurement of the distance to said substrate surface and that two lower distance sensors are arranged next to said substrate in such a manner that said print head is positioned above said lower sensors in two positions, said two positions being a first position A and a second position B, wherein said substrate surface is predetermined prior to said printing process, said distances between said two upper distance sensors and said two lower distance sensors are then measured in said first position and said distances between said two lower distance sensors and said pressure nozzles of said print heads are measured in said second position B and a height offset of said print head is obtained by means of said differences when the substrate surface is measured by means of said upper sensors.

9. The method according to claim 1, wherein said print head is moved in said direction of said printing movement so as to be mounted at an alignment handling, said alignment handling being formed from a plurality of metal plates, which are arranged parallel to one another and on top of one another, the uppermost metal plate of which is fixed so as to be immovable, wherein two adjacent metal plates are in each case functionally connected by means of guides, arbors and motors in such a manner that a lower metal plate is to be moved with at least one degree of freedom in addition to the degrees of freedom of an upper metal plate and said print head is positioned freely in the space in up to six degrees of freedom, wherein said direction of said printing movement is provided as the sole degree of freedom for the lowermost metal plate.

10. The method according to claim 9, wherein said the individual thickness and thickness variations of said substrate are initially determined by means of a thickness and thickness variation measuring device and/or a topography measuring system, wherein a section of said substrate surface is clearly determined by calibration of a printing unit, which was carried out previously, and by depositing said substrate, said print head is oriented in all directions, except for said printing direction, in such a manner that the subsequent movements of said print head in said printing direction describe a section of the substrate surface at a defined printing distance, wherein said print head is first lifted from said substrate, is aligned and is moved into its initial position and is again moved into a required distance to said substrate surface prior to said printing movement.

11. The method for positioning and guiding a print according to claim 1, further comprising the steps of:
continuing the advance of the print head in the direction of said printing direction, said printing direction being along the X axis in the case of an input/output signal at the output of the signal comparator by means of a corresponding feedback to said process actuator; and
adjusting said print head in the direction of the Z axis by means of a drive, which corresponds to a second input/output signal until a second flange of said substrate is captured by said at least one upper distance sensor.

12. The method according to claim 11, wherein said at least one upper distance sensor capture the respective distance, and said distance is measured by a means selected from the group consisting of laser triangulation, inferometrically, acoustically, chromatically confocally, capacitively, inductively and an electronic means.

13. The method according to claim 11, wherein said at least one upper distance sensor are queried by a method selected from the group consisting of analogously and at discrete points at certain times by means of the signal comparator.

14. The method according to claim 11, wherein inaccuracies in the mechanical attachment of the print head and/or positional errors, thermal expansions and/or mechanical deformations of the wafer can be determined by balancing the measuring values captured by said at least one upper distance sensor with predetermined corresponding setpoint values, and wherein said setpoint values are stored in said signal comparator and wherein said inaccuracies, errors, expansions, and deformations are compensated by a subsequent corresponding drive of said process actuators at the respective print head.

15. The method according to claim 11, wherein one-dimensional or two-dimensional process actuators are used for the alignment of the print head.

16. The method according to claim 11, wherein the measurement of said distance between said print head and said surface of said substrate is achieved by means of said at least one upper distance sensor and wherein control of the corresponding positions of said print head and said surface takes place in an online manner.

17. The method according to claim 11, wherein the adjustment movements of said print head are carried out by means of a robot.

18. The method according to claim 11, wherein the calibration of said at least one upper distance sensor and control of said process actuators is carried out according to a calibrating routine according to which provision is made for two upper distance sensors at said print head in such a manner that a connecting line thereof does not point in the direction of movement of said printing direction, wherein two measuring points describe two parallel lines during the movement of said print head in response to the measurement of the distance to said substrate surface and that two lower distance sensors are arranged next to said substrate in such a manner that said print head is positioned above said lower sensors in two positions, said two positions being a first position A and a second position B, wherein said substrate surface is predetermined prior to said printing process, said distances between said upper and said lower sensors are then measured in said first position and said distances between said lower sensors and said pressure nozzles of said print heads are measured in said second position B and a height offset of said print head is obtained by means of said differences when the substrate surface is measured by means of said upper sensors.

19. The method according to claim 11, wherein said print head is moved in said direction of said printing movement so as to be mounted at an alignment handling, said alignment handling being formed from a plurality of metal plates, which are arranged parallel to one another and on top of one another, the uppermost metal plate of which is fixed so as to be immovable, wherein two adjacent metal plates are in each case functionally connected by means of guides, arbors and motors in such a manner that a lower metal plate is to be moved with at least one degree of freedom in addition to the degrees of freedom of an upper metal plate and said print head is positioned freely in the space in up to six degrees of freedom, wherein said direction of said printing movement is provided as the sole degree of freedom for the lowermost metal plate.

20. The method according to claim 19, wherein said the individual thickness and thickness variations of said substrate are initially determined by means of a thickness and thickness variation measuring device and/or a topography measuring system, wherein a section of said substrate surface is clearly determined by calibration of a printing unit, which was carried out previously, and by depositing said substrate, said print head is oriented in all directions, except for said printing direction, in such a manner that the subsequent movements of said print head in said printing direction describe a section of the substrate surface at a defined printing distance, wherein said print head is first lifted from said substrate, is aligned and is moved into its initial position and is again moved into a required distance to said substrate surface prior to said printing movement.

* * * * *